US011362260B2

(12) United States Patent
Nakao

(10) Patent No.: US 11,362,260 B2
(45) Date of Patent: Jun. 14, 2022

(54) ACTUATOR AND TACTILE SENSATION PROVIDING APPARATUS

(71) Applicant: KYOCERA Corporation, Kyoto (JP)

(72) Inventor: Fumiaki Nakao, Kawasaki (JP)

(73) Assignee: KYOCERA Corporation, Kyoto (JP)

(*) Notice: Subject to any disclaimer, the term of this patent is extended or adjusted under 35 U.S.C. 154(b) by 945 days.

(21) Appl. No.: 16/084,646

(22) PCT Filed: Mar. 10, 2017

(86) PCT No.: PCT/JP2017/009820
§ 371 (c)(1),
(2) Date: Sep. 13, 2018

(87) PCT Pub. No.: WO2017/163945
PCT Pub. Date: Sep. 28, 2017

(65) Prior Publication Data
US 2019/0074426 A1 Mar. 7, 2019

(30) Foreign Application Priority Data

Mar. 25, 2016 (JP) .............................. JP2016-062446

(51) Int. Cl.
*H01L 41/09* (2006.01)
*H01L 41/053* (2006.01)
(Continued)

(52) U.S. Cl.
CPC ............ *H01L 41/0906* (2013.01); *B06B 1/04* (2013.01); *G06F 3/01* (2013.01); *G06F 3/016* (2013.01);
(Continued)

(58) Field of Classification Search
CPC ... H01L 41/0906; H01L 41/053; H01L 41/09; H01L 41/0933; H02N 2/0055;
(Continued)

(56) References Cited

U.S. PATENT DOCUMENTS 9,046,947 B2 6/2015 Takeda et al.
9,575,284 B2 2/2017 Tada et al.
(Continued)

FOREIGN PATENT DOCUMENTS

EP 2 202 619 A1 6/2010
EP 2 202 620 A1 6/2010
(Continued)

*Primary Examiner* — Emily P Pham
(74) *Attorney, Agent, or Firm* — Studebaker & Brackett PC

(57) ABSTRACT

An actuator includes a piezoelectric element, a vibration plate, a support, a holder, and first and second fixing portions. The vibration plate has the piezoelectric element joined thereto and bends and vibrates in accordance with expansion and contraction of the piezoelectric element. The support supports the vibration plate on a base to allow bending and vibration of the vibration plate. The holder holds an object of vibration to the vibration plate. The first fixing portion is coupled to the support and fixes the support to the base. The second fixing portion is coupled to the holder and fixes the object of vibration to the holder. The first and second fixing portions are each displaceable in a direction intersecting the direction of the expansion and contraction of the piezoelectric element.

5 Claims, 13 Drawing Sheets

(51) Int. Cl.
*H02N 2/04* (2006.01)
*G06F 3/01* (2006.01)
*B06B 1/04* (2006.01)
*G06F 3/041* (2006.01)
*H02N 2/00* (2006.01)
*H02N 2/06* (2006.01)

(52) U.S. Cl.
CPC ............ *G06F 3/041* (2013.01); *H01L 41/053* (2013.01); *H01L 41/09* (2013.01); *H02N 2/0055* (2013.01); *H02N 2/04* (2013.01); *H02N 2/06* (2013.01)

(58) Field of Classification Search
CPC .... H02N 2/04; H02N 2/06; G06F 3/01; G06F 3/016; G06F 3/041; B06B 1/04
See application file for complete search history.

(56) References Cited

U.S. PATENT DOCUMENTS

| | | |
|---|---|---|
| 9,639,160 B2 | 5/2017 | Kono et al. |
| 2006/0050059 A1* | 3/2006 | Satoh ................ G06F 3/016 345/173 |
| 2007/0080951 A1* | 4/2007 | Maruyama ............ G06F 3/016 345/173 |
| 2009/0096326 A1 | 4/2009 | Onishi et al. |
| 2013/0215080 A1 | 8/2013 | Takeda et al. |
| 2014/0362280 A1 | 12/2014 | Tada et al. |
| 2016/0004312 A1 | 1/2016 | Kono et al. |

FOREIGN PATENT DOCUMENTS

| | | |
|---|---|---|
| EP | 2 202 621 A1 | 6/2010 |
| EP | 2 207 080 A1 | 7/2010 |
| EP | 2 202 620 B1 | 2/2018 |
| JP | H01-177880 A | 7/1989 |
| JP | 2010-152889 A | 7/2010 |
| JP | 2011-054673 A | 3/2011 |
| JP | 5452729 B2 | 3/2014 |
| JP | 2014-164429 A | 9/2014 |
| JP | 2014-239575 A | 12/2014 |
| WO | 2007/026736 A1 | 3/2007 |
| WO | 2014/132629 A1 | 9/2014 |

* cited by examiner

ACTUATOR AND TACTILE SENSATION PROVIDING APPARATUS

CROSS-REFERENCE TO RELATED APPLICATION

The present application claims priority to and the benefit of Japanese Patent Application No. 2016-062446 filed Mar. 25, 2016, the entire contents of which are incorporated herein by reference.

TECHNICAL FIELD

The present disclosure relates to an actuator and a tactile sensation providing apparatus.

BACKGROUND

A touch sensor or the like provided with an actuator that generates vibration is known. In this touch sensor or the like, the actuator vibrates an object of vibration, such as the touch sensor, thereby providing a tactile sensation to a user who touches the object of vibration.

SUMMARY

An actuator according to an embodiment includes a piezoelectric element, a vibration plate, a support, a holder, a first fixing portion, and a second fixing portion. The vibration plate has the piezoelectric element joined thereto and is configured to bend and vibrate in accordance with expansion and contraction of the piezoelectric element. The support is configured to support the vibration plate on a base to allow bending and vibration of the vibration plate. The holder is configured to hold an object of vibration to the vibration plate. The first fixing portion is coupled to the support and configured to fix the support to the base. The second fixing portion is coupled to the holder and configured to fix the object of vibration to the holder. The first fixing portion and the second fixing portion are each displaceable in a direction intersecting a direction of the expansion and contraction of the piezoelectric element.

A tactile sensation providing apparatus according to an embodiment includes a base, an object of vibration, and an actuator. The actuator includes a piezoelectric element, a vibration plate, a support, a holder, a first fixing portion, and a second fixing portion. The vibration plate has the piezoelectric element joined thereto and is configured to bend and vibrate in accordance with expansion and contraction of the piezoelectric element. The support is configured to support the vibration plate on the base to allow bending and vibration of the vibration plate. The holder is configured to hold the object of vibration to the vibration plate. The first fixing portion is coupled to the support and configured to fix the support to the base. The second fixing portion is coupled to the holder and configured to fix the object of vibration to the holder. The first fixing portion and the second fixing portion are each displaceable in a direction intersecting a direction of the expansion and contraction of the piezoelectric element.

DETAILED DESCRIPTION

Figure 1:
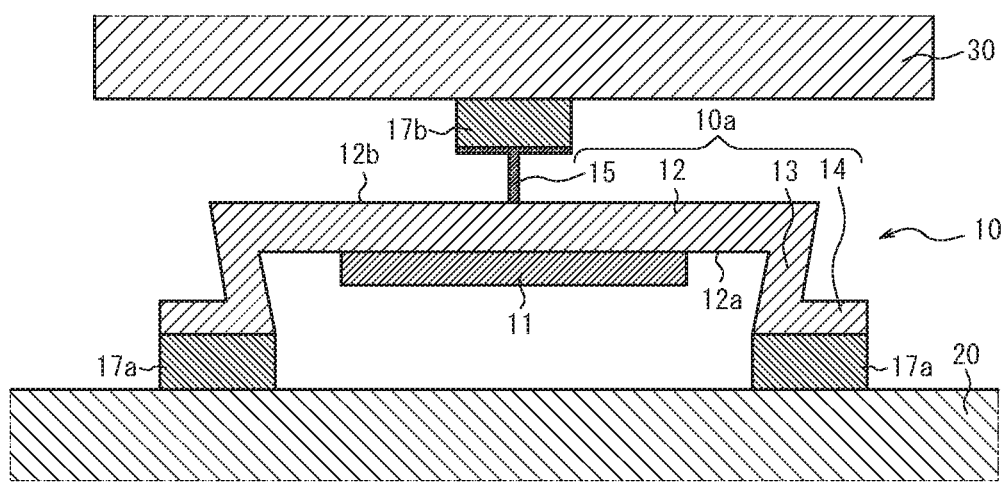
FIG. 1 is a main cross-section of an example configuration of a tactile sensation providing apparatus according to a first embodiment.

An apparatus for providing a tactile sensation provides a tactile sensation efficiently to a user by increasing the vibration of an actuator. The present disclosure relates to an actuator and a tactile sensation providing apparatus that can increase generated vibration.

An actuator and tactile sensation providing apparatus according to embodiments of the present disclosure are described below in detail with reference to the drawings.

First Embodiment

A tactile sensation providing apparatus according to a first embodiment may be used in a variety of devices. The tactile sensation providing apparatus according to the present embodiment may be an on-vehicle device such as a car navigation system, a steering wheel, or a power window switch. The tactile sensation providing apparatus may also be a mobile phone, a smartphone, a tablet personal computer (PC), a notebook PC, or the like. The tactile sensation providing apparatus is not limited to these examples and may be any of a variety of electronic devices, such as a desktop PC, a household appliance, an industrial device (factory automation (FA) device), a dedicated terminal, or the like. The drawings referred to below are schematic illustrations, and the dimensional ratios and the like in the drawings do not necessarily match the actual dimensions.

[Example Configuration of Tactile Sensation Providing Apparatus]

FIG. 1 is a main cross-section of an example configuration of a tactile sensation providing apparatus 1 according to the first embodiment. As illustrated in FIG. 1, the tactile sensation providing apparatus 1 according to the present embodiment includes an actuator 10, a housing (base) 20, and an object of vibration 30.

The actuator 10 includes a piezoelectric element 11, a vibration plate 12, supports 13, connectors 14, a holder 15, a first fixing portion 17a, and a second fixing portion 17b. In the present embodiment, the actuator 10 includes two of the first fixing portions 17a. The actuator 10 is joined to the housing 20 by the first fixing portions 17a coupled to the connectors 14. The actuator 10 is joined to the object of vibration 30 by the second fixing portion 17b coupled to the holder 15.

Figure 2A:
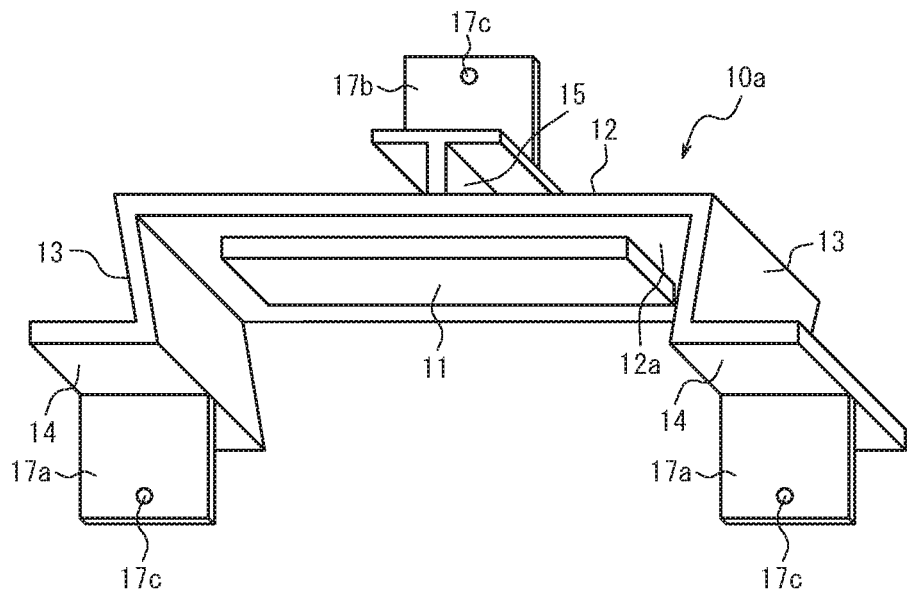
FIGS. 2A and 2B are perspective views of an example configuration of the actuator in FIG. 1.
Figure 2B:
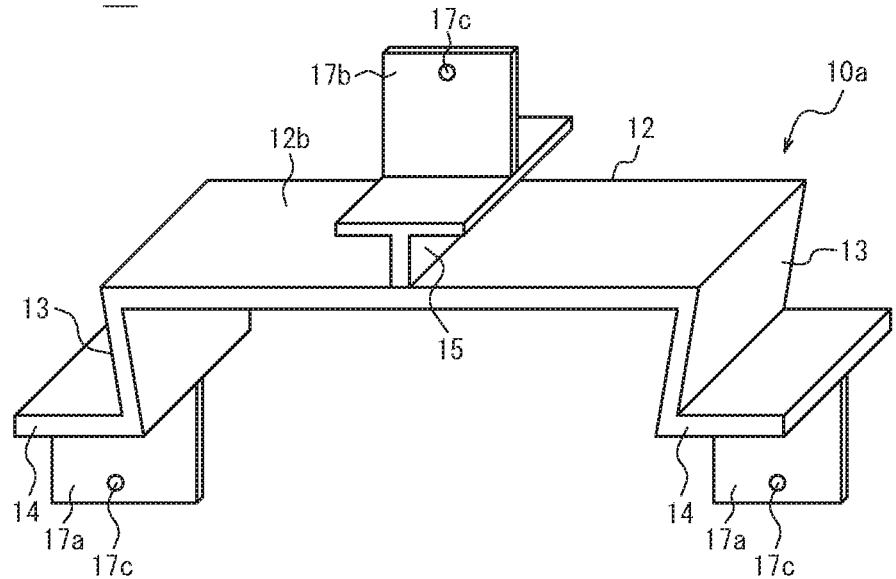

FIGS. 2A and 2B are perspective views of an example configuration of the actuator 10. FIG. 2A is a perspective view from the side joined to the housing 20. FIG. 2B is a perspective view from the side to which the object of vibration 30 is joined. Each portion of the actuator 10 is described with reference to FIGS. 1, 2A, and 2B.

The piezoelectric element 11 is, for example, rectangular. The piezoelectric element 11 expands and contracts in the longitudinal direction in a variety of patterns in accordance with an applied voltage signal. The piezoelectric element 11 may be a piezoelectric film or piezoelectric ceramic. Piezoelectric ceramic can generate vibration having a greater vibration energy than piezoelectric film can.

When the piezoelectric element 11 deforms in response to pressure from an external source, the piezoelectric element 11 outputs a voltage signal having a magnitude of voltage (voltage value) with the electric characteristic of corresponding to the magnitude of the load (force) due to the press on the piezoelectric element 11 or the rate of change (acceleration) in the magnitude of the load (force). The voltage signal output from the piezoelectric element 11 is, for example, transmitted to a controller of the device in which the actuator 10 is used. The controller of the device can control the device in accordance with the acquired voltage signal.

The vibration plate 12 is a rectangular plate-shaped member having a predetermined thickness. The vibration plate 12 is, for example, a thin plate with elasticity. The vibration plate 12 includes, for example, metal, resin, or a composite material of metal, resin, and the like. The vibration plate 12 may be a thin metal plate (sham). The surface of the vibration plate 12 facing the housing 20 is referred to below as a first surface 12a. The surface of the vibration plate 12 facing the object of vibration 30 is referred to as a second surface 12b.

The piezoelectric element 11 is provided on the first surface 12a of the vibration plate 12. The piezoelectric element 11 is arranged so that the longitudinal direction of the piezoelectric element 11 matches the longitudinal direction of the vibration plate 12. The holder 15 is provided on the second surface 12b of the vibration plate 12. The piezoelectric element 11 and the holder 15 are each joined to the vibration plate 12 by a method such as adhesion.

A structure in which the piezoelectric element 11 is provided on the first surface 12a of the vibration plate 12 is known as a monomorph. In a monomorph, the expansion and contraction of the piezoelectric element 11 provokes bending vibration of the vibration plate 12. When only one end of the vibration plate 12 is supported by the housing 20, the vibration plate 12 vibrates with the amplitude in the normal direction of the first surface 12a being maximized at the other end of the vibration plate 12. When both ends of the vibration plate 12 are supported by the housing 20, the vibration plate 12 vibrates with the amplitude in the normal direction of the first surface 12a being maximized near the center of the vibration plate 12.

A support 13 is provided at each end of the vibration plate 12 in the longitudinal direction. The supports 13 maintain a clearance between the piezoelectric element 11 and the housing 20 to prevent the piezoelectric element 11 from hitting the housing 20 when the vibration plate 12 vibrates in accordance with displacement of the piezoelectric element 11. The supports 13 are, for example, thin plates with elasticity like the vibration plate 12. The supports 13 are made of the same material as the vibration plate 12. The supports 13 may, however, be made of a different material from the vibration plate 12. As described above, when both ends of the vibration plate 12 are supported, the vibration plate 12 vibrates in accordance with displacement of the piezoelectric element 11, with the amplitude being maximized near the center of the vibration plate 12.

One end of each support 13 is connected to the vibration plate 12. The other end of each support 13 is connected to one of the connectors 14. The connector 14 is connected to the support 13 and the first fixing portion 17a. When the supports 13 and the first fixing portions 17a can be connected directly, the actuator 10 need not include the connectors 14. The connectors 14 are, for example, thin plates with elasticity like the vibration plate 12. The connectors 14 may be made of the same or different material as the vibration plate 12.

The holder 15 is connected to the object of vibration 30 by the second fixing portion 17b. The holder 15 has, for example, a T-shaped cross-section as illustrated in FIG. 1. The holder 15 is, for example, made of metal. The holder 15 may be made of a material other than metal, such as a rubber material. The holder 15 is provided on the second surface 12b of the vibration plate 12. The holder 15 is joined to the vibration plate 12 using a method such as adhesion. The holder 15 is provided near the center of the second surface 12b. However, the position at which the holder 15 is provided is not limited to being near the center. The holder 15 may be provided at the portion where the amplitude of the vibration plate 12 is maximized. The holder 15 has the object of vibration 30 joined thereto by a method such as adhesion, for example.

When the holder 15 is made of a rubber material, the holder 15 may have a large elastic modulus in the vibration direction of the vibration plate 12, i.e. in the normal direction of the first surface 12a, to efficiently transmit vibration of the vibration plate 12 to the object of vibration 30. On the other hand, the holder 15 may have a small elastic modulus in a direction parallel to the first surface 12a of the vibration plate 12. This configuration reduces the likelihood of damage to the tactile sensation providing apparatus 1 due to an external force. The elastic modulus is a constant indicating the relationship between an external force acting on a member and the amount of displacement of the member. The product of the amount of displacement and the elastic modulus represents the external force. In other words, the same external force produces a larger amount of displacement as the elastic modulus is smaller.

In the present embodiment, the holder 15 is made of the same material as the vibration plate 12. The holder 15 may, however, be made of a different material from the vibration plate 12.

In the present embodiment, the vibration plate 12, the supports 13, the connectors 14, and the holder 15 are integrally molded. The member in which the vibration plate 12, the supports 13, the connectors 14, and the holder 15 are integrally molded is also referred to below as a frame 10a of the actuator 10. The frame 10a according to the present embodiment is made of the same material throughout. The frame 10a may, for example, be integrally molded by subjecting a thin sheet of metal to sheet-metal processing to bend the thin sheet. The frame 10a may be integrally molded by welding the vibration plate 12, the supports 13, the connectors 14, and the holder 15 together. The frame 10a may be made by integrally molding resin.

The first fixing portions 17a fix the frame 10a to the housing 20. The second fixing portion 17b fixes the frame 10a to the object of vibration 30. The first fixing portions 17a and the second fixing portion 17b include, for example, metal, resin, or a composite material of metal, resin, and the like. The first fixing portions 17a and the second fixing portion 17b may, for example, be made of the same material as the frame 10a.

The first fixing portions 17a and the second fixing portion 17b are, for example, plate-shaped. The first fixing portions 17a and the second fixing portion 17b are each displaceable in a direction intersecting the expansion and contraction direction of the piezoelectric element 11. In the present embodiment, the first fixing portions 17a and the second fixing portion 17b are connected to the frame 10a so that the planes of the first fixing portions 17a and the second fixing portion 17b are displaceable in a direction orthogonal to the expanding and contracting direction of the piezoelectric element 11 and orthogonal to the direction of bending vibration of the vibration plate 12.

The first fixing portions 17a and the second fixing portion 17b each include a screw hole 17c for fixing the frame 10a to the housing 20 and the object of vibration 30. The method of fixing the frame 10a to the housing 20 and the object of vibration 30 is not limited to screwing. The frame 10a may, for example, be fixed to the housing 20 and the object of vibration 30 by adhesion. In this case, the first fixing portions 17a and the second fixing portion 17b need not include the holes 17c. At least a portion of the first fixing portions 17a and the second fixing portion 17b is exposed from the housing 20 and the object of vibration 30 of the actuator 10 when the first fixing portions 17a and the second fixing portion 17b are fixed to the housing 20 and the object of vibration 30. In other words, at least a portion of the first fixing portions 17a and the second fixing portion 17b is fixed to the housing 20 and the object of vibration 30 so as to maintain a clearance between the frame 10a and the housing 20 and between the frame 10a and the object of vibration 30.

Figure 3A:
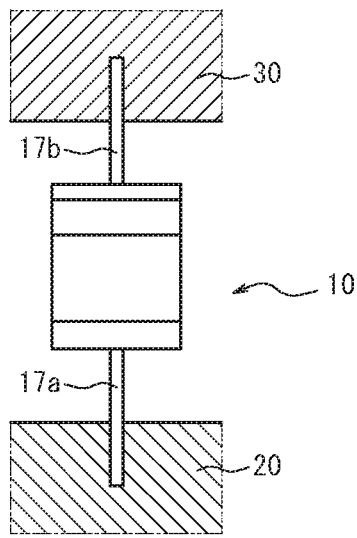
FIGS. 3A, 3B, and 3C illustrate example methods of fixing an actuator via fixing portions.
Figure 3B:
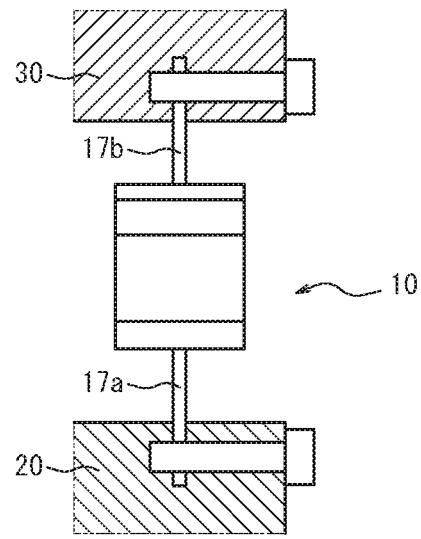
Figure 3C:
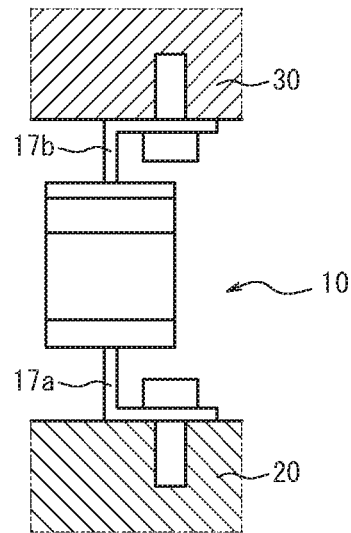

FIGS. 3A to 3C illustrate example methods of fixing the actuator 10 via the first fixing portions 17a and the second fixing portion 17b. FIGS. 3A to 3C are views of the actuator 10 from one side (from the side of one of the supports 13). For the sake of illustration, the portion of the first fixing portions 17a inserted inside the housing 20 and the portion of the second fixing portion 17b inserted inside the object of vibration 30 are also depicted in FIGS. 3A to 3C.

The actuator 10 may, for example, be fixed to the housing 20 and the object of vibration 30 by inserting the first fixing portions 17a and the second fixing portion 17b into grooves formed in the housing 20 and the object of vibration 30, as illustrated in FIG. 3A. In this case, the first fixing portions 17a and the second fixing portion 17b need not include the holes 17c.

The actuator 10 may, for example, be fixed to the housing 20 and the object of vibration 30 by inserting the first fixing portions 17a and the second fixing portion 17b into grooves formed in the housing 20 and the object of vibration 30 and screwing the first fixing portion 17a and the second fixing portion 17b in place through the holes 17c, as illustrated in FIG. 3B.

The first fixing portions 17a and the second fixing portion 17b may, for example, be formed to be L-shaped in a side view. The actuator 10 may then be fixed to the housing 20 and the object of vibration 30 by screwing the first fixing portions 17a and the second fixing portion 17b onto the surface of the housing 20 and the object of vibration 30, as illustrated in FIG. 3C. When the first fixing portions 17a and the second fixing portion 17b are screwed onto the surface of the housing 20 and the object of vibration 30, as illustrated in FIG. 3C, then grooves for insertion of the first fixing portions 17a and the second fixing portion 17b need not be formed in the housing 20 and the object of vibration 30.

As illustrated in FIG. 1 and FIGS. 3A to 3C, the actuator 10 is joined to the housing 20 at the first fixing portions 17a that are connected to the connectors 14. The housing 20 has a greater mass and a higher rigidity than the actuator 10 does. In the present embodiment, the housing 20 is therefore considered to be a rigid body.

The object of vibration 30 may, for example, be a touch sensor 50 provided in a device (see FIG. 3) or a switch. The actuator 10 is joined to the object of vibration 30 at the second fixing portion 17b connected to the holder 15. As described above, when the housing 20 is considered to be a rigid body, the vibration generated by the actuator 10 is mainly transmitted to the object of vibration 30. Hence, the object of vibration 30 can provide a tactile sensation to the user touching the object of vibration 30.

[Example Operations of Tactile Sensation Providing Apparatus]

Figure 4:
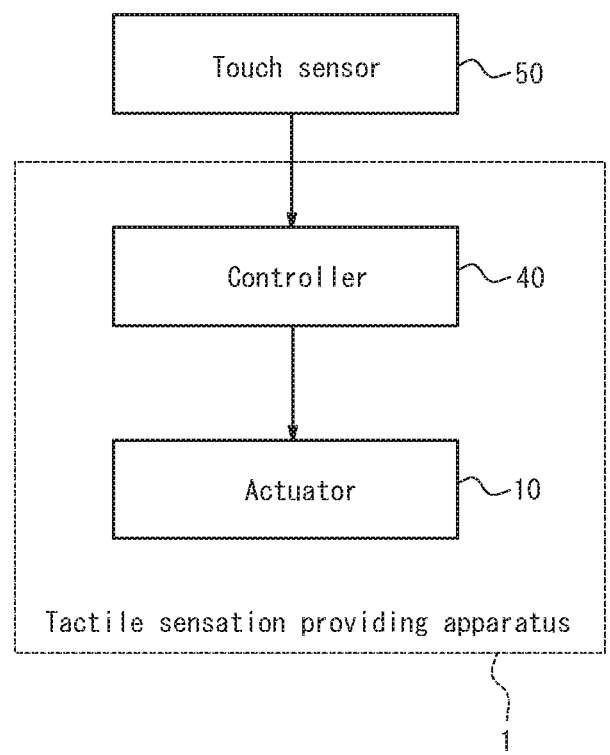
FIG. 4 is a functional block diagram illustrating an example of the schematic configuration of the tactile sensation providing apparatus in FIG. 1.

FIG. 4 illustrates an example of the functional blocks of the tactile sensation providing apparatus 1 according to the present embodiment. As illustrated in FIG. 4, the tactile sensation providing apparatus 1 includes the above-described actuator 10 and a controller 40. The controller 40 may be constituted by a processor, microcomputer, or the like capable of executing application software. The controller 40 may appropriately include a storage unit or the like constituted by memory or the like capable of storing various information as necessary.

As illustrated in FIG. 4, the controller 40 connects to the actuator 10. The controller 40 outputs a drive signal to the actuator 10. The drive signal is a voltage signal that is applied to the piezoelectric element 11 of the actuator 10.

The piezoelectric element 11 expands and contracts in the longitudinal direction in accordance with the drive signal acquired from the controller 40. The vibration plate 12 of the example actuator 10 illustrated in FIGS. 1, 2A, and 2B bends in accordance with displacement of the piezoelectric element 11. In other words, when the piezoelectric element 11 is displaced by contracting in the longitudinal direction of the vibration plate 12, the vibration plate 12 bends so that the second surface 12b becomes convex. When the piezoelectric element 11 is displaced by expanding in the longitudinal direction of the vibration plate 12, the vibration plate 12 bends so that the first surface 12a becomes convex. Displacement of the piezoelectric element 11 is thus converted into vibration in the normal direction of the first surface 12a of the vibration plate 12.

In the present embodiment, the piezoelectric element 11 is displaced only in the contracting direction in response to application of a voltage signal. In this case, the vibration plate 12 oscillates between a state in which the second surface 12b is bent to become convex and a flat, unbent state. The piezoelectric element 11 is not limited to being displaced in the contracting direction in response to application of a voltage signal. The piezoelectric element 11 may be configured to be displaced in the expanding direction in response to application of a voltage signal or to be displaced in both the expanding direction and the contracting direction.

In this way, the controller 40 drives the actuator 10 and vibrates the vibration plate 12. Vibration of the vibration plate 12 is transmitted to the object of vibration 30 through the holder 15. A tactile sensation is thus provided to the user touching the object of vibration 30.

As illustrated in FIG. 4, for example, the controller 40 may connect to the touch sensor 50. In this case, the controller 40 may output a drive signal to the actuator 10 in response to a signal acquired from the touch sensor 50. The touch sensor 50 may be the object of vibration 30 of the tactile sensation providing apparatus 1. In this case, a touch by the user on the object of vibration 30 is detected by the touch sensor 50. The controller 40 vibrates the object of vibration 30 when the user is touching the object of vibration 30. This configuration allows the tactile sensation providing apparatus 1 to provide a tactile sensation to the user touching the object of vibration 30. The touch sensor 50 may be provided as a separate structure from the object of vibration 30 of the tactile sensation providing apparatus 1.

[Shape of Frame]

Figure 5A:
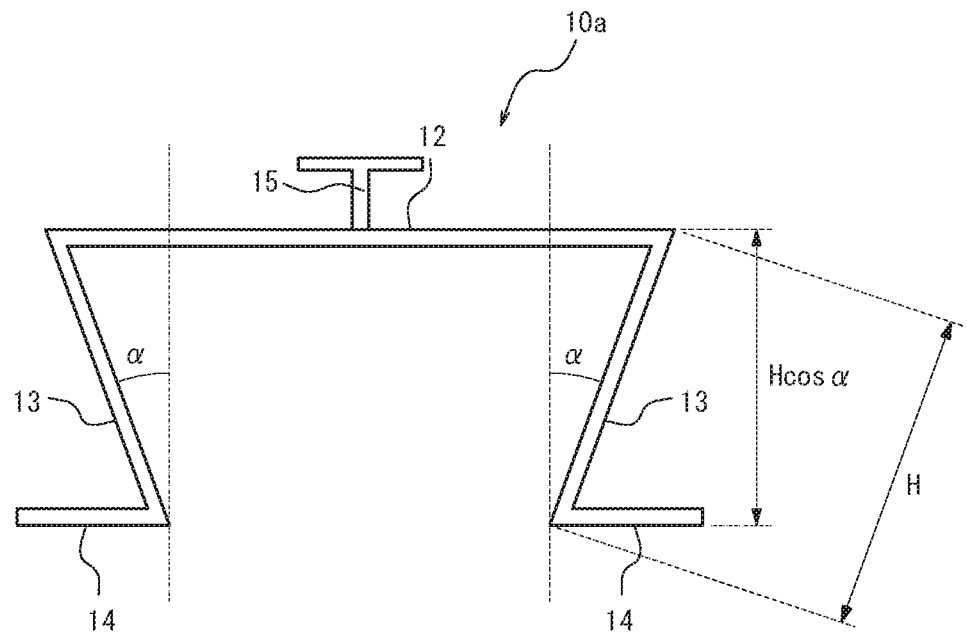
FIGS. 5A and 5B illustrate example cross-sectional shapes of a frame of the actuator in FIG. 1.
Figure 5B:
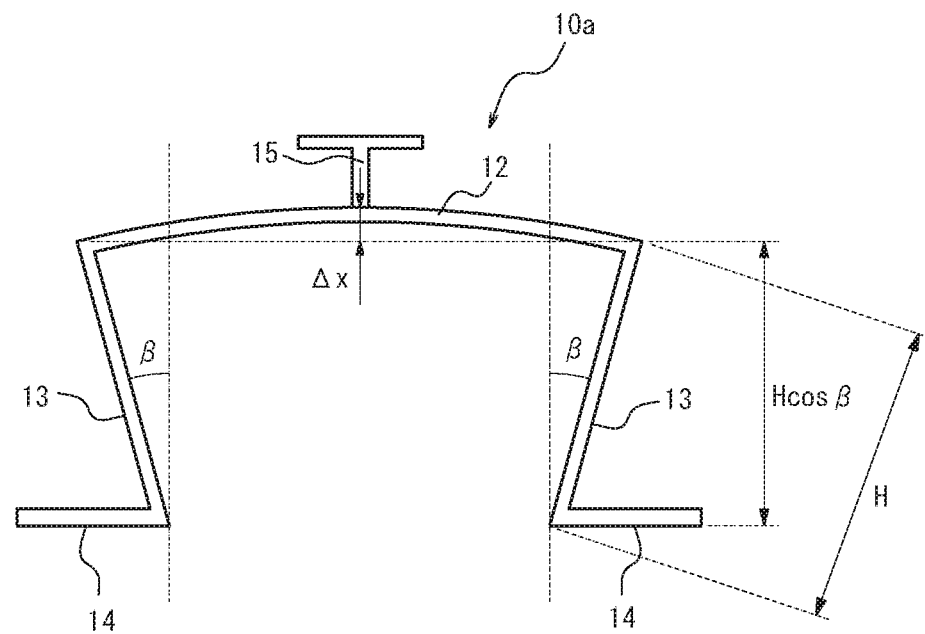

FIGS. 5A and 5B illustrate an example cross-sectional shape of the frame 10a of the actuator 10 according to the present embodiment. The frame 10a of the actuator 10 elastically deforms in response to driving of the actuator 10. FIG. 5A illustrates the shape of the frame 10a when the actuator 10 is not being driven. FIG. 5B illustrates the shape of the frame 10a when the actuator 10 is being driven. The vibration plate 12 in FIG. 5B is bent in accordance with driving of the actuator 10 so that the second surface 12b becomes convex.

As illustrated in FIG. 5A, each support 13 is arranged so that when the actuator 10 is not driven, the end of each support 13 at the side connected to the vibration plate 12 is further outward than the end at the side connected to the connector 14. The supports 13 arranged in this way are also referred to as being inclined outward. In this case, the angle between the vibration plate 12 and the support 13 is acute.

The support 13 is arranged so that the angle between the normal direction of the vibration plate 12 and the support 13 becomes α. The angle (α) is also referred to below as a given angle (α). The given angle (α) is defined as a positive value when the support 13 is inclined outward relative to the normal direction of the vibration plate 12. The given angle (α) is measured in radians. Unless otherwise noted, the units of angles in the explanation below are also radians. The given angle (α) is assumed to satisfy $-\pi \leq \alpha < \pi$ to uniquely represent the direction in which the support 13 is arranged.

The length of the support 13 is H. In this case, the distance between the end of the vibration plate 12 and the connector 14 is H cos α. The distance between the end of the vibration plate 12 and the connector 14 is defined as the length of a perpendicular from the end of the vibration plate 12 to a surface including the connector 14.

As illustrated in FIG. 5B, the vibration plate 12 bends when the actuator 10 is being driven. The displacement of the central portion of the vibration plate 12 relative to the ends is Δx (Δx>0) assuming that the displacement from the first surface 12a side towards the second surface 12b side is positive. In accordance with the bending of the vibration plate 12, the upper end of the support 13 (the end at the side connected to the vibration plate 12) is pulled by the vibration plate 12 towards the central portion of the vibration plate 12. When the support 13 is pulled by the vibration plate 12, the angle between the normal direction of the vibration plate 12 and the support 13 becomes β. The angle (β) is also referred to below as a displacement angle (β). The displacement angle (β) is defined as a positive value when the support 13 is inclined outward. Like the range of the given angle (α), the displacement angle (β) is assumed to satisfy $-\pi \leq \beta < \pi$. When the actuator 10 is driven, the upper end of the support 13 is pulled towards the central portion of the vibration plate 12. Hence, α and β satisfy the relationship α>β. The length of the support 13 is H, as in FIG. 5A. In this case, the distance between the end of the vibration plate 12 and the connector 14 is H cos β.

When comparing FIG. 5A and FIG. 5B, the change (Δy) in distance between the end of the vibration plate 12 and the connector 14 due to driving of the actuator 10 is given by Equation (1) below.

$$\Delta y = H(\cos \beta - \cos \alpha) \quad (1)$$

In Equation (1), α>β>0 and H>0. Hence, Δy>0.

The displacement of the actuator 10 transmitted to the object of vibration 30 is the sum of the displacement (Δx) of the central portion of the vibration plate 12 and the change (Δy) in the distance between the end of the vibration plate 12 and the connector 14. Since Δy>0, the displacement of the actuator 10 transmitted to the object of vibration 30 can be increased as compared to when the angle between the support 13 and the normal direction of the vibration plate 12 does not change (Δy=0).

Comparative Example

Figure 6A:
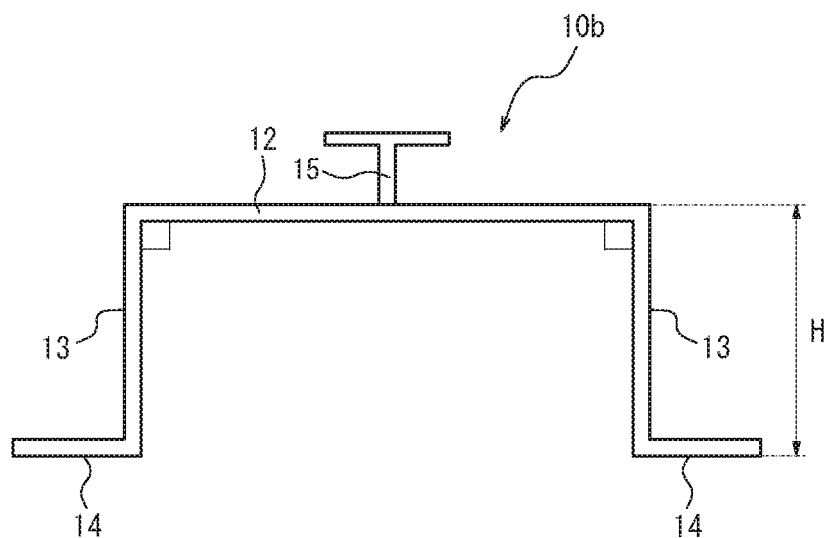
FIGS. 6A and 6B illustrate cross-sectional shapes of a frame of an actuator according to a comparative example.
Figure 6B:
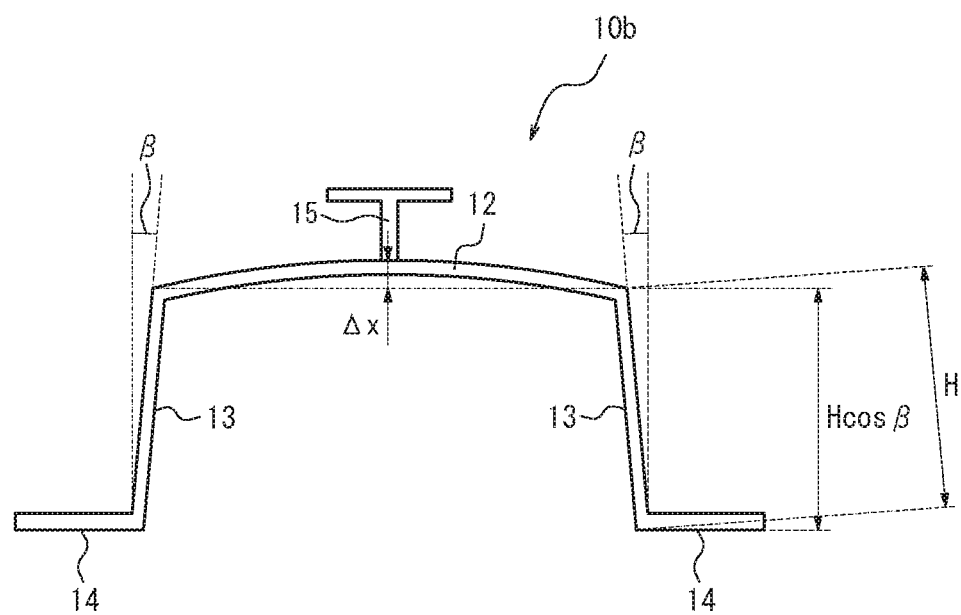

FIGS. 6A and 6B illustrate cross-sectional shapes of a frame 10b of an actuator 10 according to a comparative example. Like the frame 10a illustrated in FIG. 1 and the like, the frame 10b is a member constituted by the holder 15 and the integrally molded vibration plate 12, supports 13, and connectors 14. The frame 10b has a different cross-sectional shape than the frame 10a does. FIG. 6A illustrates the shape of the frame 10b when the actuator 10 is not being driven. FIG. 6B illustrates the shape of the frame 10b when the actuator 10 is being driven. The vibration plate 12 in FIG. 6B is bent in accordance with driving of the actuator 10 so that the second surface 12b becomes convex.

As illustrated in FIG. 6A, the supports 13 of the frame 10b are positioned to lie in the normal direction of the vibration plate 12 when the actuator 10 is not being driven. In other words, the supports 13 are orthogonal to the vibration plate 12 in FIG. 6A. The length of the support 13 is H. In this case, the distance between the end of the vibration plate 12 and the connector 14 is the same as the length (H) of the support 13.

FIG. 6B illustrates the case of the actuator 10 being driven. In this case, the vibration plate 12 bends so that the central portion of the vibration plate 12 is displaced relative to the ends by Δx at the second surface 12b side. As in FIG. 5B, the relationship Δx>0 is satisfied assuming that the displacement from the first surface 12a side towards the second surface 12b is positive. In accordance with the bending of the vibration plate 12, the upper end of the support 13 (the end at the side connected to the vibration plate 12) is pulled by the vibration plate 12 towards the central portion of the vibration plate 12. At this time, the displacement angle of the support 13 is β (where β<0 as defined above). The length of the support 13 is H, as in FIG. 5A. In this case, the distance between the end of the vibration plate 12 and the connector 14 is H cos β.

When comparing FIG. 6A and FIG. 6B, the change (Δy) in distance between the end of the vibration plate 12 and the connector 14 due to driving of the actuator 10 is given by Equation (2) below.

$$\Delta y = H(\cos \beta - 1) \quad (2)$$

In Equation (2), cos β<1 and H>0. Hence, Δy<0.

The displacement of the actuator 10 transmitted to the object of vibration 30 is the sum of the displacement (Δx) of the central portion of the vibration plate 12 and the change (Δy) in the distance between the end of the vibration plate 12 and the connector 14. Since Δy<0, the displacement of the actuator 10 transmitted to the object of vibration 30 is smaller than in the above-described example (Δy>0) of the cross-sectional shape of the frame 10a according to the present embodiment. Furthermore, the displacement of the actuator 10 transmitted to the object of vibration 30 is also smaller than when the angle between the support 13 and the normal direction of the vibration plate 12 does not change (Δy=0).

The support 13 thus has a given angle (α) in the cross-sectional shape of the frame 10a according to the present embodiment. In other words, the angle between the vibration plate 12 and the support 13 is acute. The displacement of the actuator 10 transmitted to the object of vibration 30 does not increase when the angle between the vibration plate 12 and the support 13 is a right angle, as in the cross-sectional shape of the frame 10b according to the comparative example. Although further explanation is omitted, the displacement of the actuator 10 transmitted to the object of vibration 30 clearly does not increase when the angle between the vibration plate 12 and the support 13 is obtuse, either. Hence, the frame 10a according to the present embodiment increases the displacement of the actuator 10 transmitted to the object of vibration 30.

Figure 7A:
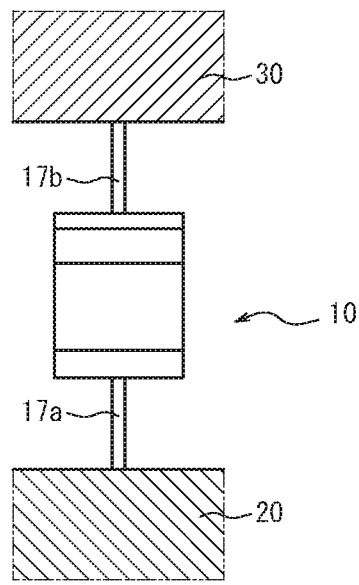
FIGS. 7A and 7B illustrate operations of an actuator fixed to a housing and to an object of vibration.
Figure 7B:
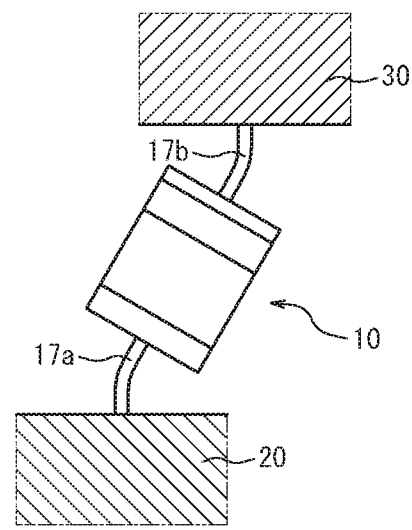

Next, operations of the actuator 10 fixed to the housing 20 and the object of vibration 30 are described with reference to FIGS. 7A and 7B. FIGS. 7A and 7B are views of the actuator 10 from one side (from the side of one of the supports 13). The actuator 10 according to the present embodiment is fixed in a state such that a portion of the first fixing portions 17a is inserted in the housing 20, and a portion of the second fixing portion 17b is inserted in the object of vibration 30, for example as illustrated in FIG. 3A. In this state, the actuator 10 vibrates when the piezoelectric element 11 is driven, for example, thereby vibrating the object of vibration 30 in the vertical direction in FIG. 7A.

FIG. 7B illustrates the state when shear stress acts on the actuator 10. As illustrated in FIG. 7B, shear stress acts on the actuator 10 when the housing 20 and the object of vibration 30 shift in opposite directions to the left and right from the state illustrated in FIG. 7A. In this case, the portion of the first fixing portions 17a exposed from the housing 20 and the portion of the second fixing portion 17b exposed from the object of vibration 30 deform due to the elasticity of the first fixing portions 17a and the second fixing portion 17b in accordance with the stress in the shearing direction. When the piezoelectric element 11 is driven in this state, the vibration of the vibration plate 12 is converted into vibration in a direction perpendicular to the housing 20 and the object of vibration 30 by the deformed first fixing portions 17a and second fixing portion 17b. The object of vibration 30 thus vibrates in the vertical direction of FIG. 7B. In this way, the actuator 10 of the present embodiment can tolerate shear stress via the first fixing portions 17a and the second fixing portion 17b.

Next, an example of operations of the actuator 10 according to the present embodiment when the actuator 10 is mounted in a predetermined device are described. Here, the case of mounting the actuator 10 in a terminal such as a smartphone is described as an example.

Figure 8A:
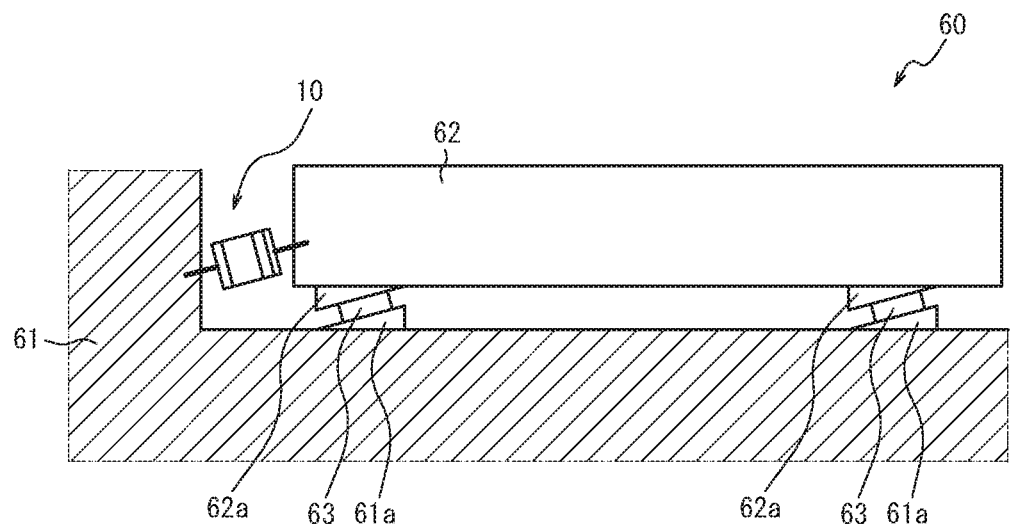
FIGS. 8A and 8B are cross-sections of a terminal illustrating an example of mounting the actuator in FIG. 1 in a terminal.
Figure 8B:
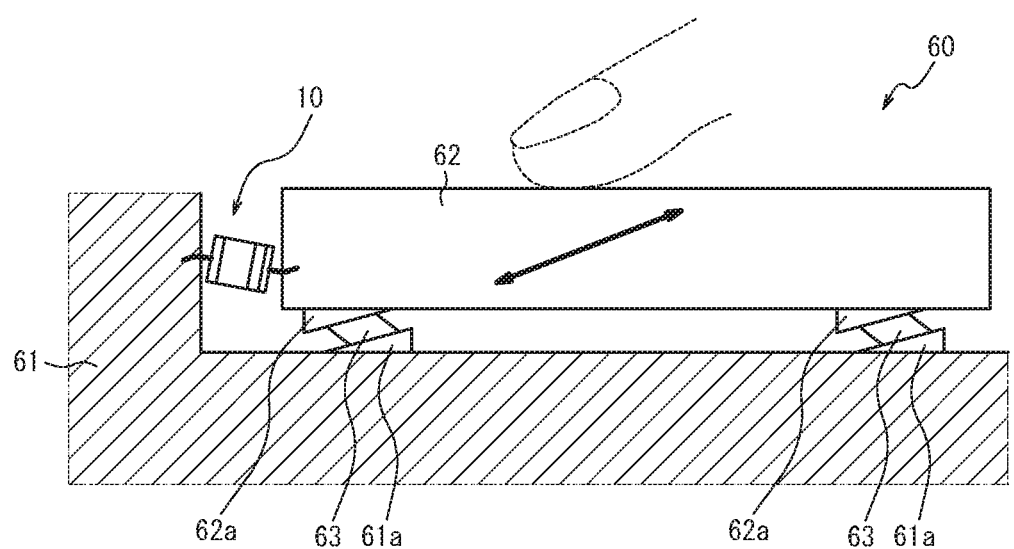

FIGS. 8A and 8B are cross-sections of a terminal illustrating an example of mounting the actuator 10 in FIG. 1 in a terminal. A terminal 60 includes a body 61 and a panel 62 disposed on the upper side of the body 61.

The body 61 is, for example, formed by metal or hard plastic. The body 61 has the appearance of a substantially rectangular parallelepiped, for example, and includes a recess for the panel 62. The body 61 corresponds to the housing 20 illustrated in FIG. 1.

The panel 62 is a touch panel that detects contact, a cover panel for protecting a display provided in the terminal 60, or the like. The panel 62 is, for example, formed by glass or synthetic resin such as acrylic. The panel 62 is a substantially rectangular parallelepiped, for example. The panel 62 may be a plate or may be a curved panel, the surface of which is gradually inclined. The panel 62 corresponds to the object of vibration 30 in FIG. 1.

The body 61 includes projections 61a, shaped substantially like right triangles, at the bottom of the recess. The panel 62 includes projections 62a, shaped substantially like right triangles, on the side at the bottom when the panel 62 is disposed in the body 61. As illustrated in FIGS. 8A and 8B, the body 61 and the panel 62 are coupled via support members 63 at inclined surfaces formed by the projections 61a and the projections 62a. The support members 63 are, for example, formed from an elastic material such as rubber.

The actuator 10 is connected between the body 61 and the panel 62. In the example in FIGS. 8A and 8B, the actuator 10 is connected between the body 61 and the panel 62 by the first fixing portions 17a and the second fixing portion 17b being inserted between the side of the body 61 formed by the recess and the side of the panel 62 when the panel 62 is disposed in the body 61.

When the piezoelectric element 11 is driven, the vibration of the actuator 10 is transmitted to the panel 62, and the panel 62 vibrates. In the example described here, the panel 62 vibrates in a diagonal direction, from the lower left to the upper right, along the inclined surface of the projections 61a and 62a, as indicated by the arrows in FIG. 8B. If the user's finger presses the panel 62 at this time, for example, the first fixing portions 17a and second fixing portion 17b of the actuator 10 deform in reaction to the shear stress generated by the press. Hence, even when under shear stress, the actuator 10 can easily subject the panel 62 to a desired vibration. In this way, the actuator 10 can tolerate shear stress via the first fixing portions 17a and the second fixing portion 17b.

In FIGS. 8A and 8B, the panel 62 was described as vibrating in a diagonal direction along the inclined surface of the projections 61a and 62a, but the vibration direction of the panel 62 is not limited to this direction. When the body 61 and the panel 62 do not include the respective projections 61a and 62a, and the panel 62 is coupled to the bottom of the recess of the body 61 via the support members 63, for example, then the panel 62 vibrates in a direction along the surface of the panel 62 (the lateral direction in FIGS. 8A and 8B). When the bottom surface of the panel 62 and the bottom of the recess of the body 61 are coupled via the actuator 10, for example, then the panel 62 vibrates in a direction perpendicular to the surface of the panel 62 (the longitudinal direction in FIGS. 8A and 8B) as a result of vibration of the actuator 10. Even when the panel 62 vibrates in the lateral direction or the longitudinal direction, shear stress may act on the actuator 10 when the user touches the panel 62 near the edge, for example. In this case as well, however, the actuator 10 can tolerate shear stress by deformation of the first fixing portions 17a and the second fixing portion 17b.

If an actuator 100 without the first fixing portions 17a and the second fixing portion 17b were to be used in the terminal 60, for example as illustrated in FIG. 7C, then the actuator 100 might not be able to provide the panel 62 with a desired vibration upon occurrence of a shear stress that is based on the positional relationship between the body 61 and the panel 62.

In this way, the first fixing portions 17a and second fixing portion 17b in the actuator 10 according to the present embodiment deform when a shear stress acts on the actuator 10. The actuator 10 can therefore easily provide the object of vibration 30 with a desired vibration even when shear stress occurs.

Second Embodiment

Figure 9:
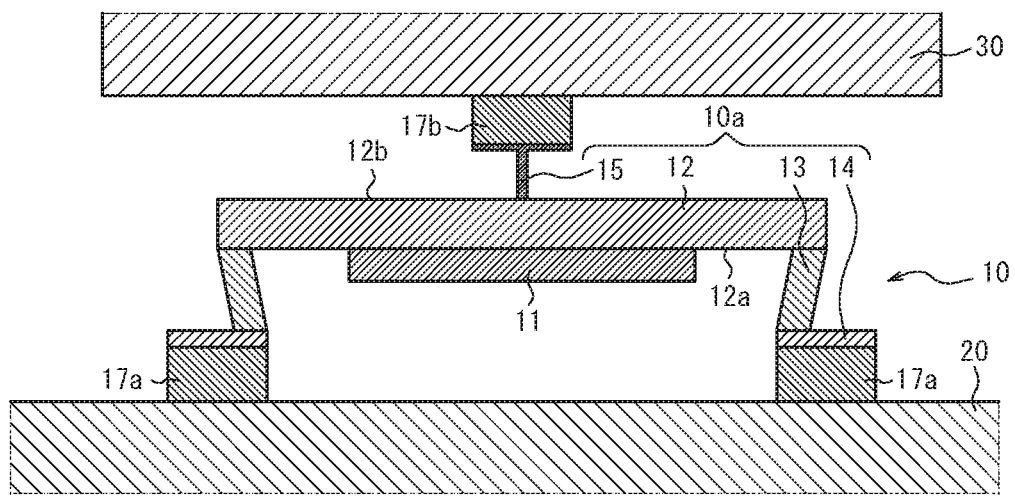
FIG. 9 illustrates an example cross-sectional shape of a frame of an actuator according to a second embodiment.

In the first embodiment, the vibration plate 12, supports 13, connectors 14, and holder 15 are integrally molded from the same material. In the second embodiment, the vibration plate 12, connectors 14, and holder 15 are made of a different material from the supports 13. FIG. 9 is a main cross-section of an example configuration of a tactile sensation providing apparatus 1 according to the second embodiment. A description of matter identical to the first embodiment is omitted as appropriate to focus mainly on the differences.

The vibration plate 12, connectors 14, and holder 15 of the present embodiment are, for example, thin plates with elasticity as in the first embodiment. The material of the vibration plate 12, the material of the connectors 14, and the material of the holder 15 may be the same or different. On the other hand, the supports 13 are pillars made of curable resin, for example, and are members with a large elastic modulus in the normal direction of the vibration plate 12. The supports 13 may be made of another material, such as metal. The supports 13 are configured to elastically deform at the joint with the vibration plate 12 and the joint with the connector 14. The supports 13 can therefore move so as to incline.

In the present embodiment, the vibration plate 12 and the supports 13 are different materials that are integrally molded together. For example, the vibration plate 12 and the supports 13 may be integrally molded by being welded together. Alternatively, the vibration plate 12 and the supports 13 may be integrally molded by molding resin that becomes the supports 13 around a metal vibration plate 12. The vibration plate 12 and the supports 13 may also be integrally molded by providing fitting portions in a metal vibration plate 12 and then engaging supports 13 made of resin with the fitting portions. The vibration plate 12 and the supports 13 may also be integrally molded by providing a joining face, with primer applied thereto, on a surface of a metal vibration plate 12 and molding resin onto the joining face. The vibration plate 12 and the supports 13 may also be integrally molded by providing a joining face, on which microfabrication has been performed, on a surface of a metal vibration plate 12 and molding resin onto the joining face.

The vibration plate 12 and the supports 13 made of different materials are integrally molded in the actuator 10 according to the present embodiment. As compared to when the vibration plate 12 and the supports 13 are configured as separate components, the present embodiment allows a reduction in the number of components and assembly steps while the supports 13 reduce attenuation of the vibration of the vibration plate 12 generated in accordance with displacement of the piezoelectric element 11. By adhesive not being used between the vibration plate 12 and the supports 13, the actuator 10 according to the present embodiment can lengthen the mean time between failure (MTBF) and improve the yield at the time of assembly.

As in the first embodiment, the angle between the vibration plate 12 and the support 13 is acute in the actuator 10 according to the second embodiment. Therefore, the actuator 10 according to the present embodiment can further increase the displacement of the actuator 10 transmitted to the object of vibration 30 as compared to when the angle between the vibration plate 12 and the support 13 is not acute.

Other Embodiments

Figure 10A:
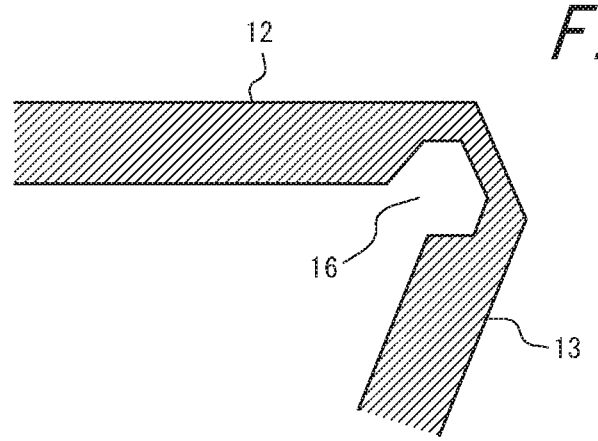
FIGS. 10A, 10B, and 10C illustrate example cross-sectional shapes of a joint between a vibration plate and a support.
Figure 10B:
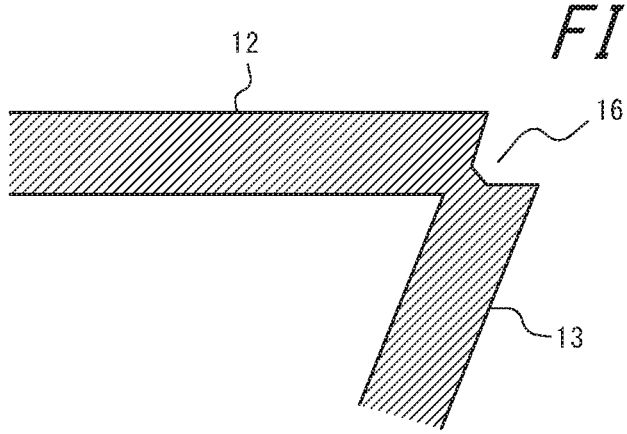
Figure 10C:
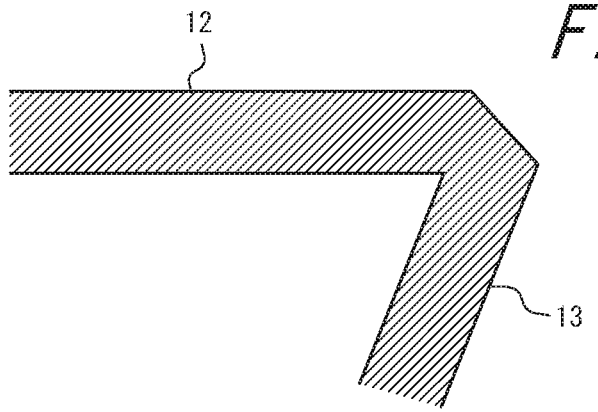

FIGS. 10A, 10B, and 10C illustrate examples of the cross-sectional shape of a joint between the vibration plate 12 and the support 13. FIG. 10A illustrates an example of the cross-sectional shape when a notch 16 is provided on the inside of the joint (the side that connects to the first surface 12a of the vibration plate 12). FIG. 10B illustrates an example of the cross-sectional shape when a notch 16 is provided on the outside of the joint (the side that connects to the second surface 12b of the vibration plate 12). FIG. 10C illustrates a comparative example in which a notch 16 is not provided on the inside or the outside.

The joint between the vibration plate 12 and the support 13 in FIGS. 10A and 10B bends more easily than the example illustrated in FIG. 10C by virtue of the notch 16 being provided. The upper portion of the support 13 is therefore pulled towards the central portion of the vibration plate 12 more easily, preventing bending of the vibration plate 12 from being impeded when the actuator 10 is driven.

The notch 16 illustrated in FIGS. 10A and 10B may be provided in the joint between the support 13 and the connector 14. This configuration can increase the difference between the given angle ($\alpha$) and the displacement angle ($\beta$) of the support 13.

Figure 11A:
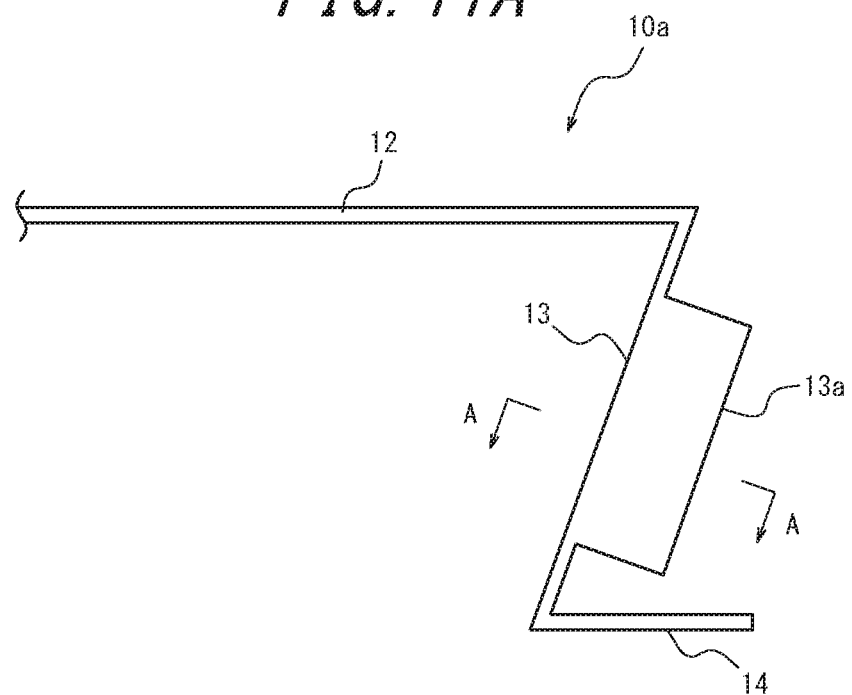
FIGS. 11A and 11B illustrate an example support provided with a rib.
Figure 11B:
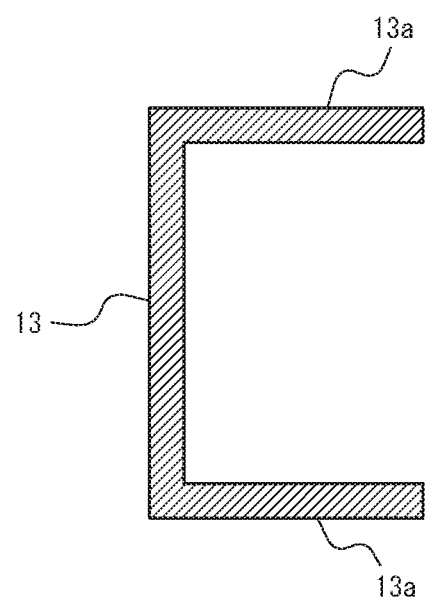

FIGS. 11A and 11B illustrate examples of a support 13 provided with a rib 13a. FIG. 11A illustrates an example cross-sectional shape of the frame 10a of the actuator 10. FIG. 11B is a cross-section along the A-A line in FIG. 11A. Provision of the rib 13a in the support 13 as illustrated in FIG. 11B increases the rigidity of the support 13 relative to the normal direction of the vibration plate 12. In other words, this configuration can reduce the amount of deformation of the support 13 due to the force acting on the support 13 as a reaction to the force that the actuator 10 exerts on the object of vibration 30. The vibration generated by the actuator 10 thus tends to be absorbed less by the support 13. Consequently, the vibration generated by the actuator 10 is transmitted more efficiently to the object of vibration 30.

The supports 13 may be configured so that the ends of the vibration plate 12 are displaced more in the longitudinal direction than in the normal direction of the vibration plate 12 in accordance with expansion and contraction of the piezoelectric element 11. When the supports 13 are thus configured for smaller displacement of the ends of the vibration plate 12 in the normal direction of the vibration plate 12, the vibration of the vibration plate 12 is efficiently transmitted to the object of vibration 30. When the supports 13 are configured for greater displacement of the ends of the vibration plate 12 in the longitudinal direction of the vibration plate 12, attenuation of the vibration of the vibration plate 12 is reduced.

Figure 12A:
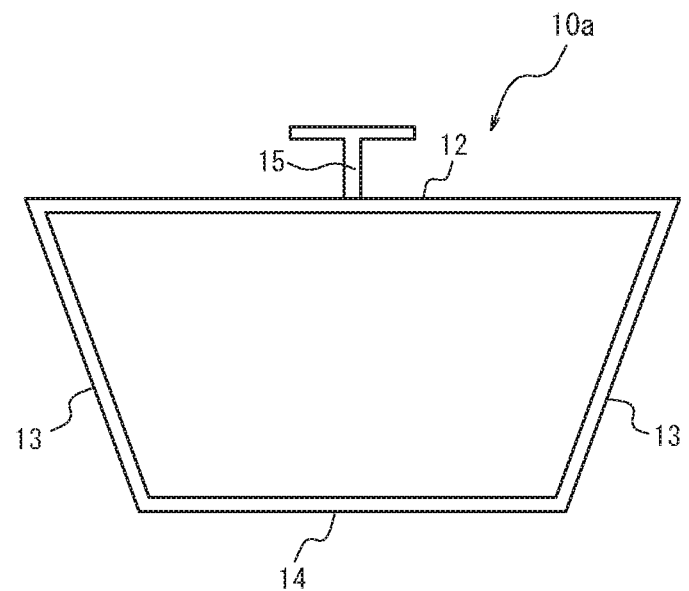
FIGS. 12A and 12B illustrate example frames in which connectors at either side are bent inward and connected.
Figure 12B:
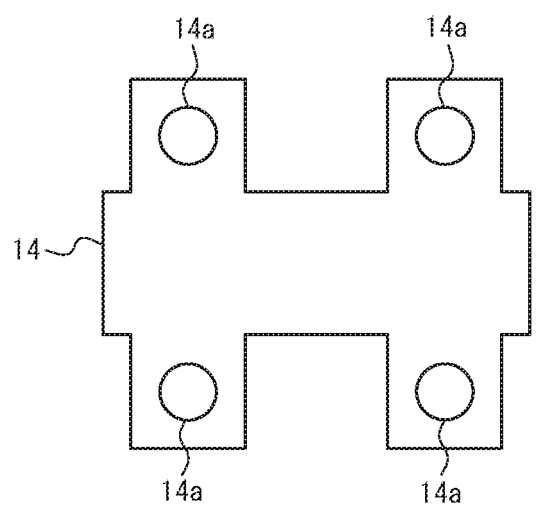

FIGS. 12A and 12B illustrate examples of frames 10a in which the connectors 14 at either side are bent inward and connected. FIG. 12A illustrates the cross-sectional shape of the frame 10a. FIG. 12B is a plan view of the frame 10a. The cross-sectional shape of the frame 10a becomes trapezoidal as a result of the connectors 14 being connected as in FIG.

12A. This structure increases the strength of the frame 10a as compared to when the connectors 14 are formed separately. In FIG. 12B, screw holes 14a are provided beside the fixing portions 14 to facilitate screwing of the connectors 14 to the housing 20.

(Example of Calculating Displacement)

Figure 13A:
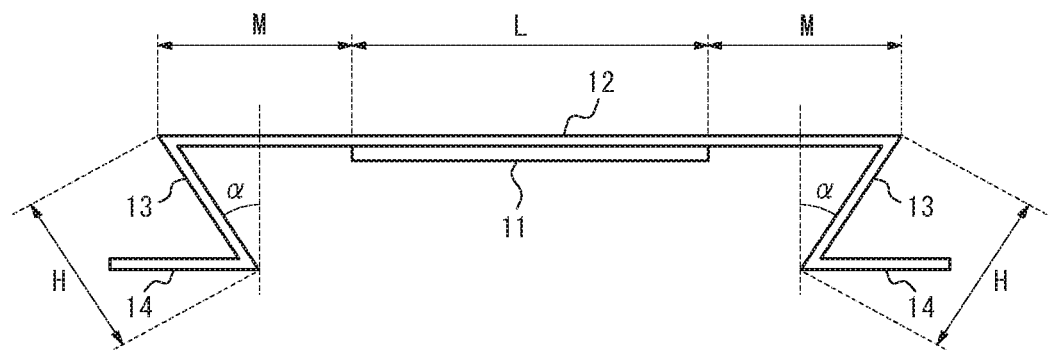
FIGS. 13A and 13B illustrate example dimensions of each part when an actuator is driven.
Figure 13B:
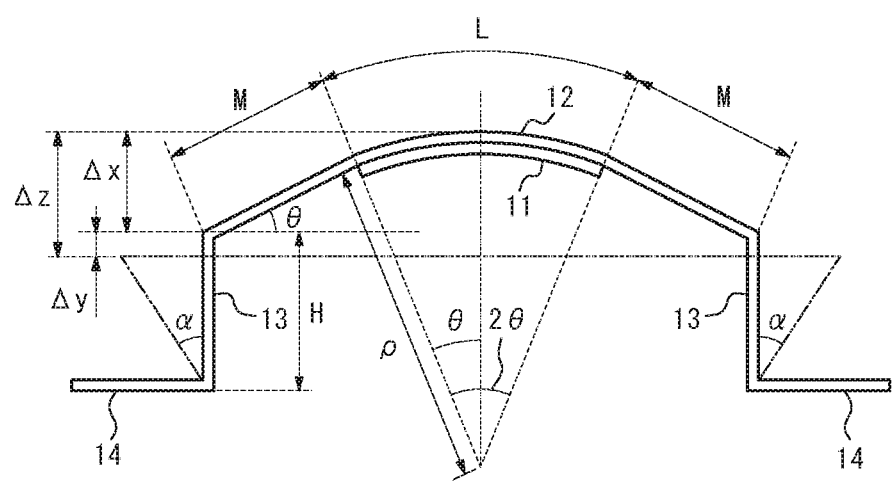

FIGS. 13A and 13B illustrate example dimensions of each part at the time of driving of the actuator 10. Here, an example of calculating the displacement of the central portion of the vibration plate 12 when the actuator 10 is driven is described with reference to FIGS. 13A and 13B. Note that the holder 15 is omitted in FIGS. 13A and 13B.

FIG. 13A illustrates example dimensions of each part when the actuator 10 is not being driven. The longitudinal dimension of the piezoelectric element 11 is L. The piezoelectric element 11 is disposed at a distance (M) from each end of the vibration plate 12. The longitudinal dimension of the vibration plate 12 is L+2M. The length of the support 13 is H. The angle (given angle) formed by the support 13 and the normal direction of the vibration plate 12 is α. The ends of the supports 13 coupled to the connectors 14 are fixed by the connectors 14. The supports 13 are pivotable about the ends of the supports 13.

FIG. 13B illustrates example dimensions of each part when the actuator 10 is driven. As a result of contraction of the piezoelectric element 11, the vibration plate 12 bends so that the second surface 12b becomes convex (see FIG. 1). The shape of the vibration plate 12 and the support 13 when the actuator 10 is not being driven is indicated in FIG. 13B by dashed double-dotted lines. The displacement (Δx) of the central portion of the vibration plate 12 relative to the ends (the joints between the vibration plate 12 and the supports 13) is given by Equation (3) below.

$$\Delta x = M \sin\theta + \rho(1 - \cos\theta) \quad (3)$$

In Equation (3), ρ is the radius of curvature when the vibration plate 12 bends, and θ is the difference in the angle between the bent state and the unbent state at the ends of the vibration plate 12. The interior angle of the bent portion of the vibration plate 12, i.e. the interior angle of the sector having the bent portion as an arc, is expressed as 2θ. The radius of curvature (ρ) and the interior angle (2θ) are determined by factors such as the amount of displacement of the piezoelectric element 11 or the ratio between the thickness of the piezoelectric element 11 and the thickness of the vibration plate 12.

When the radius of curvature (ρ) or the interior angle (2θ) of the bent portion is known, the displacement angle (β) of the support 13 can be calculated with Equation (4) below.

$$\beta = \alpha - M(1 - \cos\theta)/H \quad (4)$$

In Equation (4), an approximation based on the Taylor expansion of a trigonometric function is used, taking α, β, and θ to be minute values. In other words, it is assumed that $\sin\alpha \approx \alpha$, $\sin\beta \approx \beta$, and $\sin\theta \approx \theta$. Furthermore, it is assumed that $\sin\theta \approx L/2\rho$.

When the support 13 is parallel to the normal direction of the vibration plate 12, the displacement angle (β) of the support 13 becomes 0 in accordance with the radius of curvature (ρ) and the interior angle (2θ). When β=0 in Equation (4), the given angle (α) satisfies the relationship in Equation (5) below.

$$\alpha = M(1 - \cos\theta)/H \quad (5)$$

In FIG. 13B, bending of the vibration plate 12 causes the supports 13 to become parallel to the normal direction of the vibration plate 12 when the actuator 10 is not driven. In this case, the change (Δy) in the distance between the end of the vibration plate 12 and the connector 14 is given by Equation (6) below.

$$\Delta y = H(1 - \cos\theta) \quad (6)$$

The displacement (Δz) of the central portion of the vibration plate 12 is the sum of Δx and Δy. Accordingly, the displacement (Δz) of the central portion of the vibration plate 12 illustrated in FIG. 13B is given by Equation (7) below, which is based on Equation (3) and Equation (6).

$$\Delta z = M \sin\theta + \rho(1 - \cos\theta) + H(1 - \cos\theta) \quad (7)$$

On the basis of Equation (1), the relationship Δy>0 is satisfied when the given angle (α) and the displacement angle (β) satisfy the relationship $\cos\alpha < \cos\beta$. Here, the relationship α>β is satisfied in the actuator 10 according to the first embodiment and the like. Hence, Δy>0 if β≥0. It follows that Equation (8) below represents a sufficient condition on the given angle (α) for the relationship Δy>0 to be satisfied.

$$\alpha \geq M(1 - \cos\theta)/H \quad (8)$$

Accordingly, an appropriate setting of the given angle (α) of the support 13 to satisfy Equation (8) increases the amplitude of the central portion of the vibration plate 12.

Although embodiments have been described with reference to the drawings and examples, it is to be noted that various changes and modifications will be apparent to those skilled in the art based on the present disclosure. Therefore, such changes and modifications are to be understood as included within the scope of the present disclosure.

The invention claimed is:

1. An actuator comprising:
   a piezoelectric element;
   a vibration plate that has the piezoelectric element joined thereto and is configured to bend and vibrate in accordance with expansion and contraction of the piezoelectric element;
   a support configured to support the vibration plate on a base to allow bending and vibration of the vibration plate;
   a holder configured to hold an object of vibration to the vibration plate;
   a first fixing portion coupled to the support and configured to fix the support to the base; and
   a second fixing portion coupled to the holder and configured to fix the object of vibration to the holder;
   wherein the first fixing portion and the second fixing portion are each displaceable in a direction intersecting a direction of the expansion and contraction of the piezoelectric element.

2. The actuator of claim 1, wherein the first fixing portion and the second fixing portion have a plate shape, and a plane of the plate shape is displaceable in a direction intersecting the direction of the expansion and contraction of the piezoelectric element.

3. The actuator of claim 1, wherein the vibration plate, the support, and the holder are integrally molded.

4. The actuator of claim 1, wherein the support is configured so that an end of the vibration plate is displaced more in the direction of the expansion and contraction of the piezoelectric element than in a normal direction of the vibration plate in accordance with the expansion and contraction of the piezoelectric element.

5. A tactile sensation providing apparatus comprising:
   a base;
   an object of vibration; and an actuator comprising:
- a piezoelectric element;
- a vibration plate that has the piezoelectric element joined thereto and is configured to bend and vibrate in accordance with expansion and contraction of the piezoelectric element;
- a support configured to support the vibration plate on the base to allow bending and vibration of the vibration plate;
- a holder configured to hold the object of vibration to the vibration plate;
- a first fixing portion coupled to the support and configured to fix the support to the base; and
- a second fixing portion coupled to the holder and configured to fix the object of vibration to the holder;

wherein the first fixing portion and the second fixing portion are each displaceable in a direction intersecting a direction of the expansion and contraction of the piezoelectric element.

* * * * *